United States Patent
Black et al.

(10) Patent No.: US 7,977,247 B2
(45) Date of Patent: Jul. 12, 2011

(54) FIELD EFFECT TRANSISTOR DEVICE INCLUDING AN ARRAY OF CHANNEL ELEMENTS

(75) Inventors: Charles T. Black, New York, NY (US); Ricardo Ruiz, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 355 days.

(21) Appl. No.: 11/873,316

(22) Filed: Oct. 16, 2007

(65) Prior Publication Data

US 2008/0213956 A1    Sep. 4, 2008

Related U.S. Application Data

(62) Division of application No. 11/124,325, filed on May 6, 2005, now abandoned.

(51) Int. Cl.
*H01L 21/302* (2006.01)
*H01L 21/461* (2006.01)
*G03F 1/00* (2006.01)
*G03F 7/00* (2006.01)

(52) U.S. Cl. ........ 438/716; 438/945; 438/947; 438/948; 438/949; 438/736; 430/323

(58) Field of Classification Search .................. 427/198; 438/717, 551, 736, 942, 952, 975
See application file for complete search history.

(56) References Cited

U.S. PATENT DOCUMENTS

| | | | |
|---|---|---|---|
| 5,948,470 A | 9/1999 | Harrison et al. | |
| 6,872,647 B1 | 3/2005 | Yu et al. | |
| 2002/0009859 A1* | 1/2002 | Oh | 438/311 |
| 2003/0006410 A1 | 1/2003 | Doyle | |
| 2005/0250053 A1* | 11/2005 | Marsh et al. | 430/323 |

OTHER PUBLICATIONS

Yang-Kyu Choi, et al., "A Spacer Patterning Technology for Nanoscale CMOS", IEEE Transactions on Electron Devices, vol. 49, No. 3, pp. 436-441, Mar. 2002.
Hari Ananthan, "FinFET—Current Research Issues", hanantha@ecn.purdue.edu.
J. Kedzierski, et al., "High-performance symmetric-gate and CMOS-compatible $V_t$ asymmetric-gate FinFET devices", 2001 IEEE, pp. IEDM 01-437-440.
D. Hisamoto, et al. FinFET—A Self-Aligned Double-Gate MOSFET Scalable to 20 nm, IEEE Transactions on Electron Devices, vol. 47, No. 12, pp. 2320-2325, Dec. 2000.

* cited by examiner

*Primary Examiner* — Andy Huynh
*Assistant Examiner* — Valerie Brown
(74) *Attorney, Agent, or Firm* — Scully, Scott, Murphy & Presser, P.C.; Vazken Alexanian

(57) ABSTRACT

The present invention relates to a semiconductor structure such as a field effect transistors (FETs) in which the channel region of each of the FETs is composed of an array of more than one electrically isolated channel. In accordance with the present invention, the distance between each of the channels present in the channel region is within a distance of no more than twice their width from each other. The FETs of the present invention are fabricated using methods in which self-assembled block copolymers are employed in forming the channel.

18 Claims, 13 Drawing Sheets

FIELD EFFECT TRANSISTOR DEVICE INCLUDING AN ARRAY OF CHANNEL ELEMENTS

RELATED APPLICATION

This application is a divisional application of U.S. patent application Ser. No. 11/124,325, filed May 6, 2005.

FIELD OF THE INVENTION

The present invention relates to semiconductor devices and methods of fabricating the same. More particularly, the present invention relates to field effect transistors (FETs) in which the channel region of each of the FETs is composed of an array of more than one electrically isolated channel. In accordance with the present invention, the distance between each neighboring channel is less than or equal to twice the width of an individual channel within the array. The FETs of the present invention are fabricated using methods in which self-assembled block copolymers are employed in forming the channel region.

BACKGROUND OF THE INVENTION

The dimensions of semiconductor field effect transistors (FETs) have been steadily shrinking over the last thirty 30 years or so, as scaling to smaller dimensions leads to continuing device performance improvements. Planar FET devices have a conducting gate electrode positioned above a semiconducting channel, and electrically isolated from the channel by a thin layer of gate dielectric. Applying voltage to the conducting gate controls current through the channel.

For a given device length, the amount of current drive for an FET is defined by the device width (w). Current drive scales proportionally to device width, with wider devices carrying more current than narrower device. This idea is illustrated schematically in FIGS. 1A-1C. Specifically, FIGS. 1A-1C are cross sectional views of planar FETs including a semiconductor substrate 10, a gate dielectric 12 and a gate conductor 14. As shown, the FET of FIG. 1A has a device width w, the FET of FIG. 1B has a device width of $2w$ and the FET of FIG. 1C has a device width of $3w$. In these devices, the width can be changed to any arbitrary value, as it is defined lithographically. Different parts of integrated circuits (ICs) require FETs to drive different amounts of current, i.e., with different device widths, which is particularly easy to accommodate in planar FET devices by merely changing the device gate width (using lithography).

With conventional planar FET scaling reaching fundamental limits, the semiconductor industry is looking at more unconventional device geometries, which will facilitate continued performance improvements. One such class of device geometries involves transforming the transistor's semiconducting channel from a planar sheet into an array of parallel channel elements. Single devices of this type have current flowing through multiple channel elements in parallel.

Devices utilizing such channel arrays come in different flavors, and can be summarized as follows:

a. finFET: In a typical finFET structure, one of the channel array elements is a semiconducting "fin" of width w and height h, where typically w<h. The gate dielectric and gate conductor are positioned around the fin such that current flows down the channel on the two sides of the fin (generally, finFETs do not use the fin top surface as part of the conducting channel).

b. tri-gate FET: In such a device, one of the channel array elements has width w and height h, with w~h, or w>h. The gate dielectric and gate conductor are positioned around the channel such that current flows down the channel on three sides.

c. nanowire FET: In this device, one of the channel array elements has width w and height h roughly equal. That is, w~h. Typically, in a nanowire FET, the gate dielectric and gate conductor are positioned around the channel such that current flows down the channel on three sides. In other implementations, the gate conductor and gate dielectric wrap all around the nanowire elements such that current flows down the entire nanowire perimeter. Nanowires are also often cylindrical rather than the cubic shape shown in FIG. 2.

The channel array elements of the foregoing described devices are shown, for example, in FIG. 2, where reference numeral 16 denotes an insulator such as an oxide, and reference numeral 18 denotes a semiconductor such as, for example, Si, Ge, SiGe, GaAs, InAs, InP and other III/V or II/VI compound semiconductors.

Adjusting the current drive of any of these channel array FETs is not as straightforward as for the planar FET described above. One approach is to adjust the channel element (e.g., fin, tri-gate element, nanowires) dimensions for different devices, i.e., increasing h for some devices would increase their current drive relative to others. From a fabrication standpoint however, this approach is difficult and impractical.

Rather, current drive in these devices can be more easily adjusted using the scheme shown in FIGS. 3A-3C, where reference numeral 16 is an insulator, reference numeral 18 is a semiconductor, reference numeral 12 is a gate dielectric including, for example, $SiO_2$, SiON, SiN, metal oxides, or mixed metal oxides, and reference numeral 14 is a gate conductor including polySi, a conductive elemental metal, an alloy including at least one conductive elemental metal, or a nitride or silicide of a conductive elemental metal. In these devices, current drive is increased by incrementally adding channel elements in parallel.

Specifically, the device shown in FIG. 3A is composed of one channel element, while the device shown in FIG. 3B contains two channel elements and the device shown in FIG. 3B contains three channel elements. Correspondingly, the device shown in FIG. 3C drives three times as much current (i.e., three times the device width) as the device shown in FIG. 3A. In these FETs, the device width w is controlled by adding channel discrete elements in parallel. The three devices shown in FIGS. 3A-3C have widths of $2h$, $4h$, and $6h$, respectively. Arbitrarily large current drives can be achieved by adding channel elements to the device.

A main difficulty in fabricating any of these devices consisting of multiple channel elements (i.e., more than one fin, more than one nanowire, etc.) is in patterning and placement of the channel array elements. It is desirable that channel element widths (w) are small, i.e., in the range of 1-50 nm, which is below the limits of conventional lithographic techniques. Several specialized techniques can be used to pattern at these dimensions (described below), however these invariably come at a cost of being able to position the elements close to one another. In other words, it is extremely difficult to pattern small channel elements, which are also closely spaced. This combination is ideally sought for practical implementation of these channel array FET devices.

Generally speaking, formation of the channel array elements comprising these advanced FET designs requires patterning at sub-lithographic dimensions. While certainly there have been device demonstrations using different methods of high-resolution "research" types of lithography (such as electron-beam lithography), the discussion herein is limited to methods which are considered manufacturable. That is, methods that have a high-throughput, and are cost effective.

One approach is illustrated schematically in FIGS. 4A-4E. FIG. 4A shows a cross sectional view of a photoresist line 20 which has been patterned on top of a thin semiconducting layer 18; the semiconductor layer 18 lays atop an insulator 16. The photoresist 20 is "trimmed" in FIG. 4B by exposure to, for example, an $O_2$ plasma. This removes organic resist from all sides (and top) exposed to the plasma, resulting in a linewidth reduction below the initially defined structure (shown in FIG. 4C). The remaining photoresist pattern 20 is transferred into the underlying semiconductor layer 18 by, for example, reactive-ion etching (RIE) (FIG. 4D), and finally the photoresist line 20 is removed (FIG. 4E).

This approach shown schematically in FIGS. 4A-4E works well for FET devices composed of a single channel element, however difficulties arise when adopting the technique to pattern devices composed of more than one element.

FIGS. 5A-5C show another approach that can be used in forming such FET devices. FIG. 5A shows the initial photoresist pattern for forming an FET of two channel array elements. In these drawing, elements 20, 18, and 16 are as described above in FIGS. 4A-4E. After the $O_2$ trim to reduce linewidths, which is shown in FIG. 5B, the remaining structures have a large space between them (FIG. 5C). This is, of course, due to the fact that the feature center-positions cannot change during the $O_2$ trim. In an optimal device, these channel array elements would be packed as tightly as possible.

Another method for forming sub-lithographic FET channel elements involves the use of what is known as "sidewall" processes, and is illustrated in FIGS. 6A-6I) and 7A-7C. Initially, a line 26 in a conventional first hard mask material (e.g., silicon dioxide) is formed using standard lithography and RIE on a stack containing semiconductor 18 and insulator 16 (FIG. 6A). Conformal deposition of a second hard mask material 28 (e.g., silicon nitride) on top of this structure results in the situation shown in FIG. 6B. An anisotropic etch of this second material 28 removes it from the semiconductor 18 as well as the top of the patterned line 26, while leaving material on the sides (FIG. 6C). Finally, the first hard mask material 26 can be selectively removed by, e.g., wet chemical etching, leaving only the free-standing sidewall material 28 (FIG. 6D). The width of these sidewall features is determined by the deposition thickness of the second material. Sidewall processes are difficult in practice, however there have been several demonstrations of devices based on such processes.

Sidewall processes do not naturally lend themselves to form channel elements (the process shown in FIGS. 6A-6D forms two sidewalls), however this difficulty can be sidestepped by careful consideration of the initial line patterning step. The technique encounters greater difficulty when patterning devices formed of more than two channel elements, as shown in FIGS. 7A-7C. This structure shows two lithographically-defined lines 30 atop a stack including layers 18 and 16 which result in 4 free-standing sidewalls 32 (FIG. 7C). As shown in FIGS. 7A-7C, sidewall processes also result in less-than-optimal device packing, and irregularly-spaced elements within a single device.

In view of the above, there is still a need for providing methods, which form structures which have inherent advantages over all prior art methods. That is, there is a need for providing channel array FET devices where each channel element has a width that is equal to or less than 50 nm, preferably less than 20 nm, and each channel array is comprised of elements where regular spacing between elements is equal to or less than 100 nm, preferably less than 40 nm.

SUMMARY OF THE INVENTION

Achieving improvements over the conventional means of forming the channel array FETs described above requires better control over element dimensions and efficient packing of device channel elements into arrays in which the spacing between each element is uniform and regular. The present invention provides a method for achieving these improvements, which leads to the optimal device structure.

As mentioned above, previous demonstrations have used oxygen plasma trimming or sidewall spacer processes to define the widths of FET channel elements—these techniques have the inherent limitations on packing density as previously described. The present invention provides a method of fabricating FET channel elements using a self-assembly process, which sets the dimensions, density, and uniformity of the elements. For purposes of this application, the term "self-assembly" denotes the spontaneous organization of a material into a regular pattern. The characteristic dimensions of self-assembled films depend on fundamental length scales (such as molecular size), and are therefore both uniform and controllable.

There are several self-assembling systems that can result in regular arrays of channel elements. In the present invention, a system based on a diblock or triblock copolymer self-assembly is typically used. Under suitable process conditions, the block copolymer molecules can microphase separate on a nanometer-scale length scale, forming arrays of lines and spaces in a thin polymer film. Many different block copolymers such as, for example, a block copolymer of polystyrene and poly(methyl methacrylate) can be used for this process.

Specifically, and in broad terms, the present invention provides an article comprising an array of elements having uniform and regular spacing between each of said elements that is equal to or less than 101 nm, each element having a width that is equal to or less than 50 nm.

In one embodiment of the present invention the width of the elements is less than 20 nm and the spacing between the elements is less than 40 nm.

The present invention also provides a field effect transistor that comprises a source region and a drain region located in a semiconductor material; a channel region located between said source and drain regions; a gate dielectric located above said channel region; and a gate conductor located on said gate dielectric, wherein said channel region is composed of an array of more than one electrically isolated channel having a space there between, said space between each neighboring channel is located within a distance that is less than or equal to twice the width of each channel of said array.

The present invention also provides a method of forming the above mentioned structures that include the use of a block copolymer self-assembly process. Specifically, and in one embodiment, the method of the present invention includes the steps of: forming at least one opening in a semiconductor substrate, said at least one opening defining a channel region for a semiconductor device; forming a block copolymer having the formula A-B or A-B-A, where A comprises a polymer of a mono alkenyl arene and B is a polymer of acrylic acid, methacrylic acid or an ester thereof; selectively removing block B from within the at least one opening, leaving block A as a patterned mask; and etching exposed portions of the semiconductor substrate within the at least one opening to provide said channel region having an array of more than one electrically isolated channel, with the space between each neighboring channel being less than or equal to twice the width of an individual channel of said array.

In one embodiment, the block copolymer may comprise an asymmetric diblock copolymer that comprises about 60% or greater, preferably from about 60% to about 80%, of block A, and about 40% or less, preferably from about 20% to 40%, of B block. This embodiment provides a template for etching the device channel array in which each of the individual channel array elements is defined by the matrix of cylindrical phase diblock copolymer pattern. In another embodiment, the block copolymer may comprise a symmetric diblock copolymer that comprises from about 40% to about 60%, preferably 50%, of block A, and from about 40% to about 60%, preferably 50%, of block B. In this embodiment, the template for defining the device channel array is provided in which each of the individual channel array elements is defined by a lamellar (i.e., sheet-like) polymer domain. In yet another embodiment, another asymmetric diblock copolymer is used in which block A is present in an amount of less than about 40%, preferably from about 20% to about 40%, and block B is present in an amount of greater than about 60%, with an amount from about 60% to about 80% being more preferred. In this embodiment, the template for the device channel array is provided in which each of the individual array elements is defined by a cylindrical polymer domain. The amounts of each of the blocks are based on weight percent of the total copolymer (e.g., 100 wt).

In a preferred embodiment, block A of the block copolymer is comprised of polystyrene (PS) and block B of the block copolymer is comprised of a poly(methyl methacrylate) (PMMA).

BRIEF DESCRIPTION OF THE DRAWINGS

In FIG. 3A, the width is 2h, in FIG. 3B, the width is 4h, and in FIG. 3C, the width is 6h.

DETAILED DESCRIPTION OF THE INVENTION

The present invention, which provides an improved channel array semiconductor device and methods of fabricating the same, will now be described in greater detail by referring to the following discussion as well as drawings that accompany the present application. It is noted that the drawings of the present application are provided for illustrative purposes and thus they are not drawn to scale.

Figure 1A:
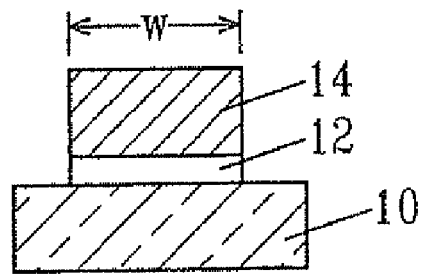
FIGS. 1A-1C are pictorial representations (through cross sectional views) of prior art planar FET devices having different device widths. Specifically, devices widths w, 2w and 3w are shown in FIGS. 1A-1C, respectively.
Figure 1B:
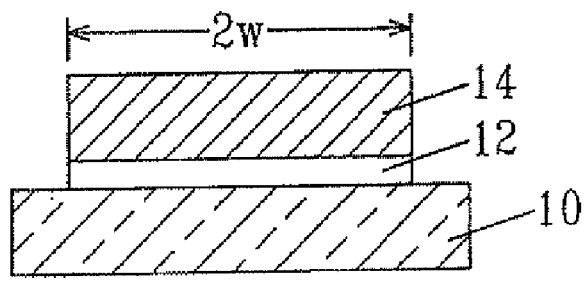
Figure 1C:
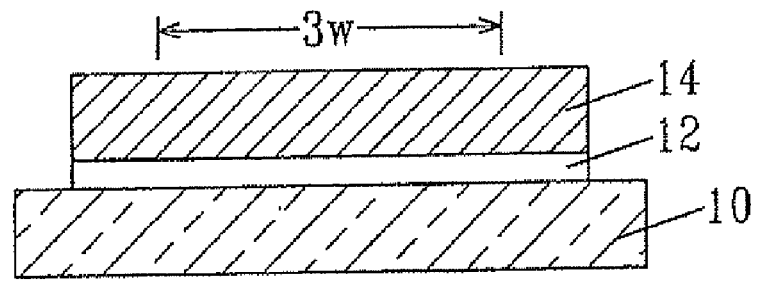
Figure 2:
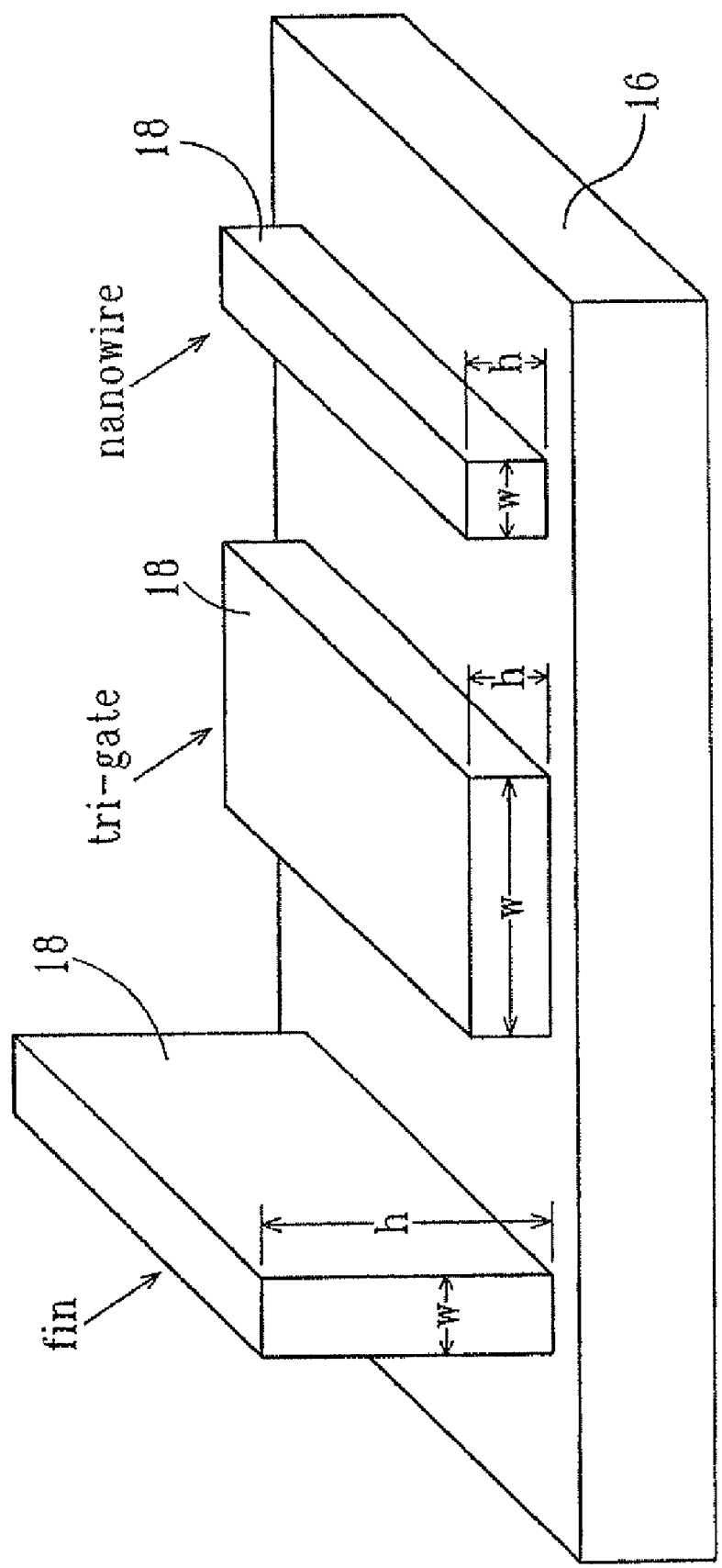
FIG. 2 is a pictorial representation of three different channel elements for channel array FET devices. Specifically, finFET, tri-gate and nanowire elements are shown atop an insulator.
Figure 3A:
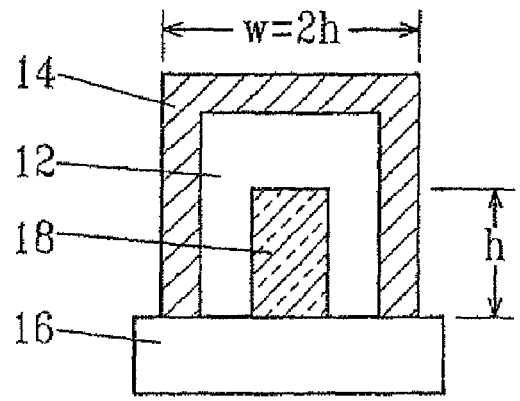
FIGS. 3A-3C are pictorial representations (through cross sectional views) showing various prior art FET devices formed using channel elements (either finFET, tri-gate or nanowire). In these drawings, the device width is controlled by adding discrete elements in parallel.
Figure 3B:
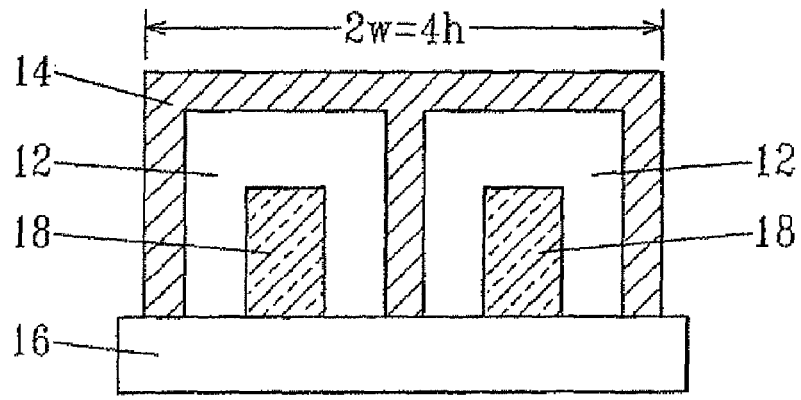
Figure 3C:
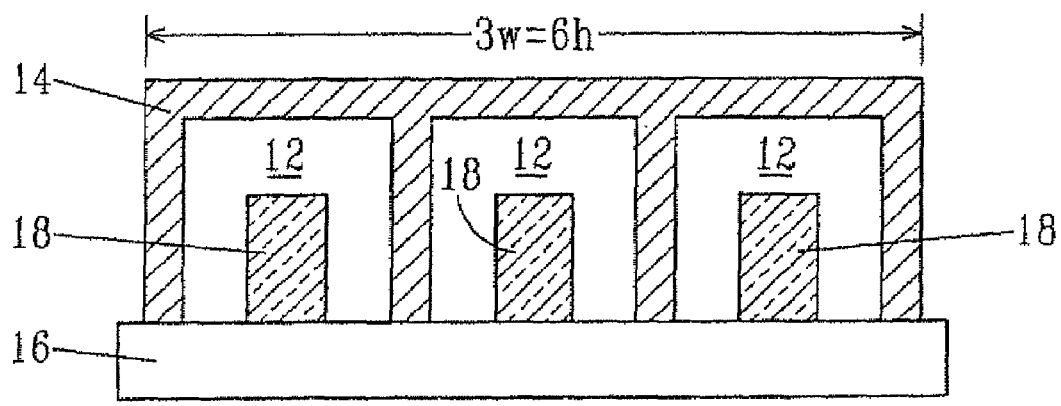
Figure 4A:
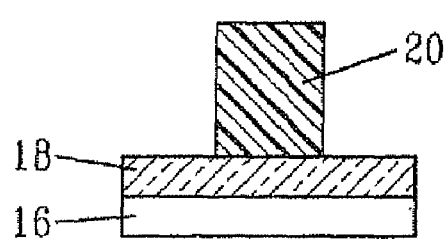
FIGS. 4A-4E are pictorial representations (through cross sectional views) of a channel element that is prepared using a prior art $O_2$ plasma trimming process.
Figure 4B:
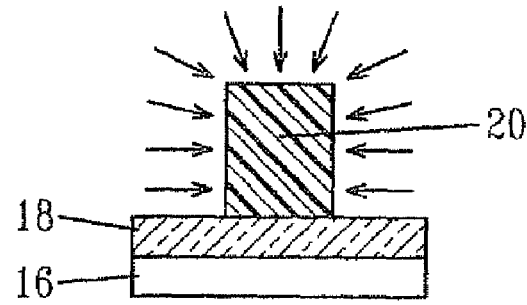
Figure 4C:
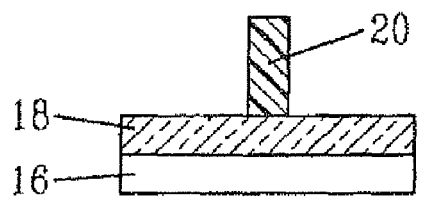
Figure 4D:
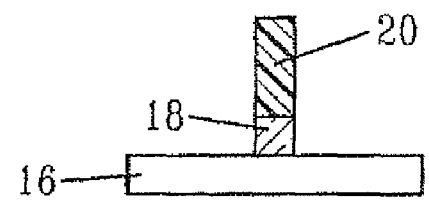
Figure 4E:
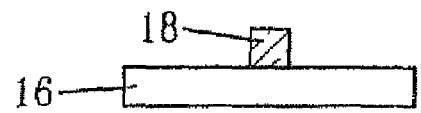
Figure 5A:
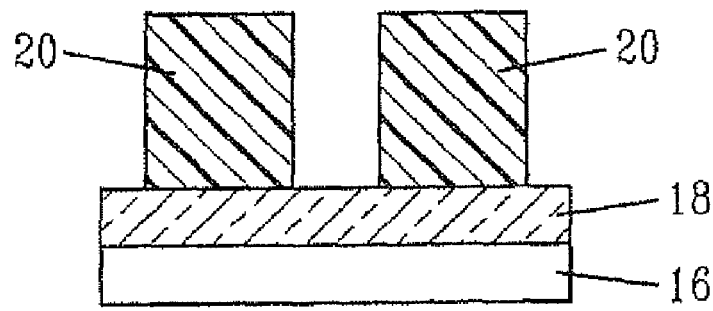
FIGS. 5A-5C are pictorial representations (through cross sectional views) illustrating the formation of two FET channel elements using a prior art $O_2$ plasma trimming process.

Reference is first made to FIG. 5A which is a cross sectional view of a structure 100 that includes the inventive channel region of the present invention. Specifically, the structure 100 includes a semiconductor substrate 102 having a channel region 120 located at an upper surface thereof. In accordance with the present invention, the channel region 120 includes an array of more than one, preferably greater than two, electrically isolated channel 122 in which each neighboring channel 122 within the array is located within a distance $D_1$ of less than or equal to twice the width w of an individual channel. The channel region 120 is located within a portion of the semiconductor substrate 102 and it comprises patterned semiconductor material remaining after performing one of the self-assembly methods of the present invention and etching.

The semiconductor substrate 102 may be comprised of a bulk semiconductor material including, for example, Si, Ge, SiGe, SiC, SiGeC, Ge, GaAs, GaN, InAs, InP and all other III/V or II/VI compound semiconductors. Semiconductor substrate 102 may also comprise an organic semiconductor or a layered semiconductor such as Si/SiGe, a silicon-on-insulator (SOI), a SiGe-on-insulator (SGOI) or germanium-on-insulator (GOI). Preferably, and as illustrated in the drawings, the semiconductor substrate 102 is a semiconductor-on-insulator substrate that includes a bottom semiconductor layer 104 and a top semiconductor layer 108 that are separated by a buried insulator 106. The buried insulator 106 may comprise a crystalline or non-crystalline oxide or nitride, for example. In some embodiments of the present invention, it is preferred that the semiconductor substrate 102 be composed of a Si-containing semiconductor material, i.e., a semiconductor material that includes silicon. The semiconductor substrate 102 may be doped, undoped or contain doped and undoped regions therein. The semiconductor substrate 102 may include a single crystal orientation or it may include at least two coplanar surface regions that have different crystal orientations (the latter substrate is referred to in the art as a hybrid substrate). When a hybrid substrate is employed, the NFET is typically formed on a (100) crystal surface, while the pFET is typically formed on a (110) crystal plane. The hybrid substrate can be formed by techniques that are well known in the art.

The semiconductor substrate 102 may also include a first doped (n- or p-) region, and a second doped (n- or p-) region. For clarity, the doped regions are not specifically shown in the drawing of the present application. The first doped region and the second doped region may be the same, or they may have different conductivities and/or doping concentrations. These doped regions are known as "wells" and they are formed utilizing conventional ion implantation processes.

At least one isolation region (not shown) is then typically formed into the semiconductor substrate 102. The isolation region may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the at least one isolation region provides isolation between neighboring gate regions, typically required when the neighboring gates have opposite conductivities, i.e., nFETs and pFETs. The neighboring gate regions can have the same conductivity (i.e., both n- or p-type), or alternatively they can have different conductivities (i.e., one n-type and the other p-type).

Figure 8A:
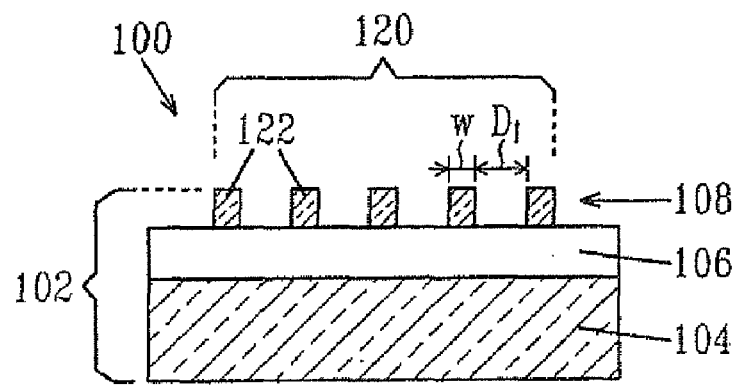
FIG. 8A is a pictorial representation (through a cross sectional view) illustrating a semiconductor structure including the channel array region of the present invention.

It is noted that the channel region 120 shown in FIG. 8A is fabricated using one of the methods to be described in greater detail herein below. FIGS. 12A-12G provide a schematic of such a process flow that can be used in the present invention. Details concerning the channel region 120 are also provided herein below.

Figure 8B:
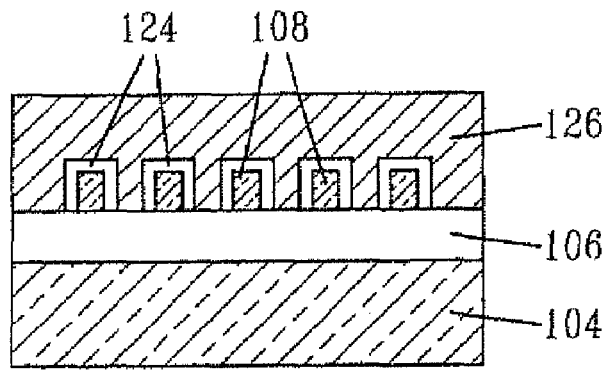
FIG. 8B is a pictorial representation (through a cross sectional view) illustrating a FET device of the present invention which includes the channel region depicted in FIG. 8A.
Figure 8C:
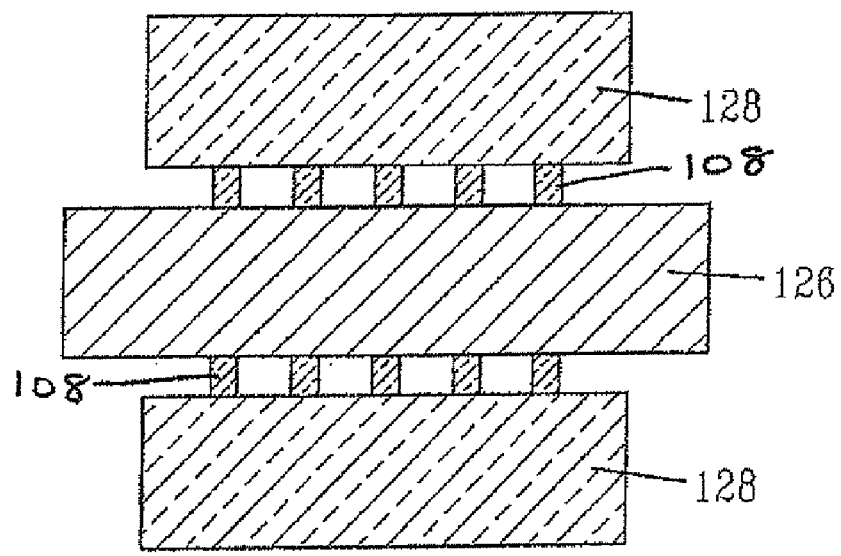
FIG. 8C is a top down view of FIG. 8B.

Following the formation of the structure 100 shown in FIG. 8A, a conventional CMOS process can be used in forming at least one FET that includes the inventive channel region 120. The resultant FET structure that is formed after performing the conventional CMOS is shown in FIGS. 8B and 8C. This FET structure includes a gate dielectric 124 located on exposed walls of each individual channel 122 and a gate conductor 126 located on said substrate 102 and atop the channel region 120 that has been lined with the gate dielectric 124. The gate dielectric 124 may be the same thickness on all sides of the individual channel 122 (as shown in the figure), or it may have a different thickness on the top surface of the individual channel 122 relative to the sides of the individual channel 122.

The gate dielectric 124 can be formed by a deposition process such as, for example, chemical vapor deposition (CVD), plasma-assisted CVD, metalorganic chemical vapor deposition (MOCVD), atomic layer deposition (ALD), evaporation, reactive sputtering, chemical solution deposition and other like deposition processes. Alternatively, the gate dielectric 124 can be formed by a thermal process such as oxidation, nitridation or oxynitridation. The gate dielectric 124 may also be formed utilizing any combination of the above processes.

The gate dielectric 124 is comprised of $SiO_2$, SiN, SiON, a high k metal oxide or a mixed metal oxide, or multilayers thereof. The term "high k" is used herein to denote an insulator having a dielectric constant of greater than about 4.0, preferably greater than 7.0. When the gate dielectric 124 is a high k gate dielectric, it typically comprises a metal oxide or a mixed metal oxide that may optionally include silicon or nitrogen. Some examples of high gate dielectrics that can be employed in the present invention include: $HfO_2$, $HfSiO_x$, $ZrO_2$, $ZrSiO_x$, $Al_2O_3$, $TiO_2$, $La_2O_3$, $SrTiO_3$, $LaAlO_3$, $CeO_2$, $Y_2O_3$ and multilayers thereof.

The physical thickness of the gate dielectric 124 may vary, but typically, the gate dielectric 24 has a thickness from about 0.5 to about 10 nm, with a thickness from about 0.5 to about 3 nm being more typical.

Next, the gate conductor 126 is formed over the structure, including the channel region 120 that is lined with the gate dielectric 124, utilizing a conventional deposition process such as, for example, CVD, plasma-assisted CVD, MOCVD, atomic layer deposition (ALD), evaporation, reactive sputtering, chemical solution deposition, plating and other like deposition processes. The gate conductor 126 is comprised of any conductive material including, for example, doped polySi, doped amorphous Si, doped SiGe, an elemental metal, an alloy including at least one elemental metal, an elemental nitride, an elemental silicide or multilayers thereof. Examples of metal gate conductors include, but are not limited to: TiN, TaSiN, TaN, W, Co, Ni, Cu, Cr, Mo and other like materials.

When amorphous Si, polySi or SiGe are used, the doping thereof may occur in-situ during the deposition process itself. Or alternatively, these materials may be first deposited and then subjected to a subsequent ion implantation process that introduces either an n- or p-type dopant within a predetermined portion of the gate conductor.

Figure 5B:
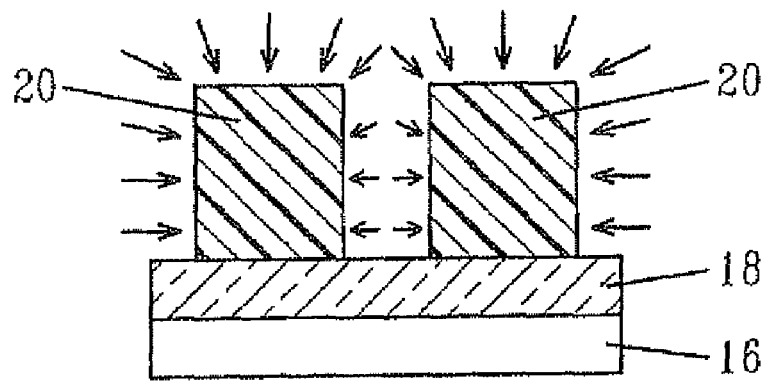
Figure 5C:
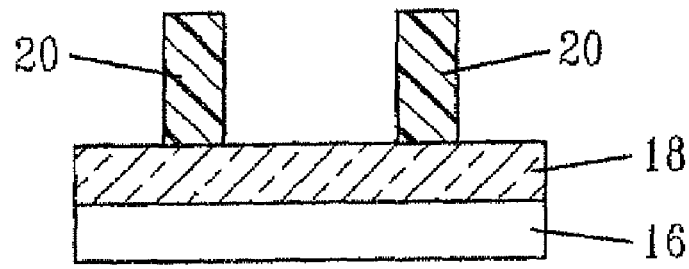
Figure 6A:
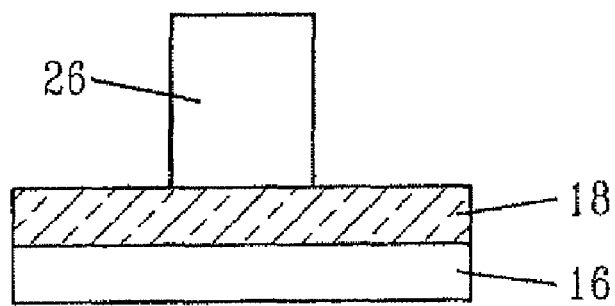
FIGS. 6A-6D are pictorial representations (through cross sectional views) illustrating a structure including two FET channel elements that are prepared using a prior art sidewall process.
Figure 6B:
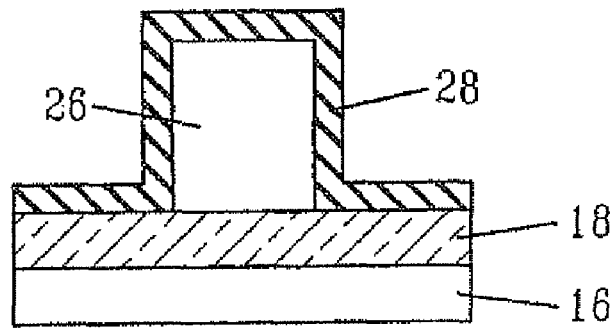
Figure 6C:
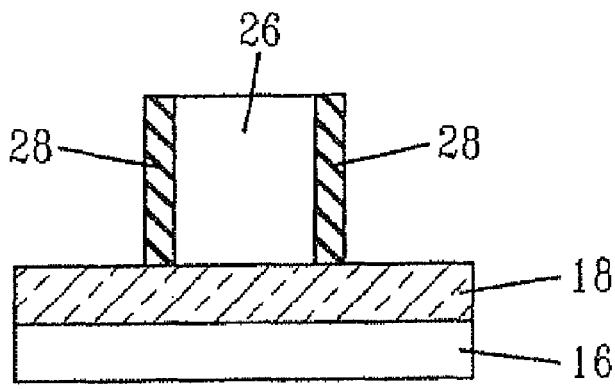
Figure 6D:
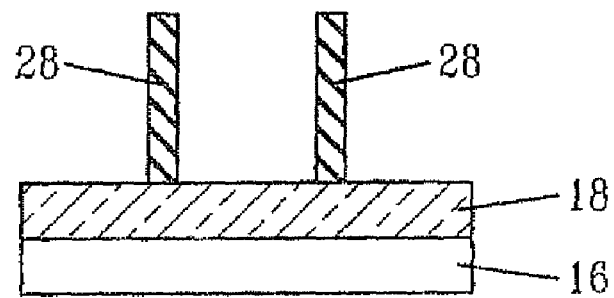
Figure 7A:
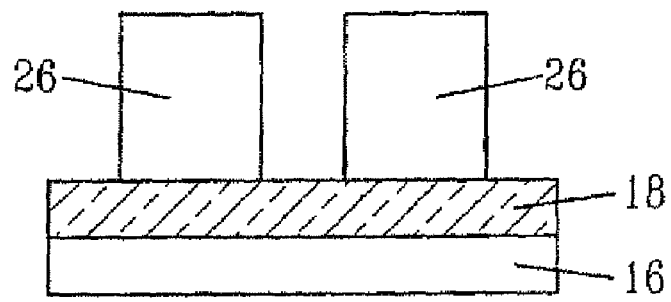
FIGS. 7A-7C are pictorial representations (through cross sectional views) illustrating the formation of four FET channel elements using a prior art sidewall process.
Figure 7B:
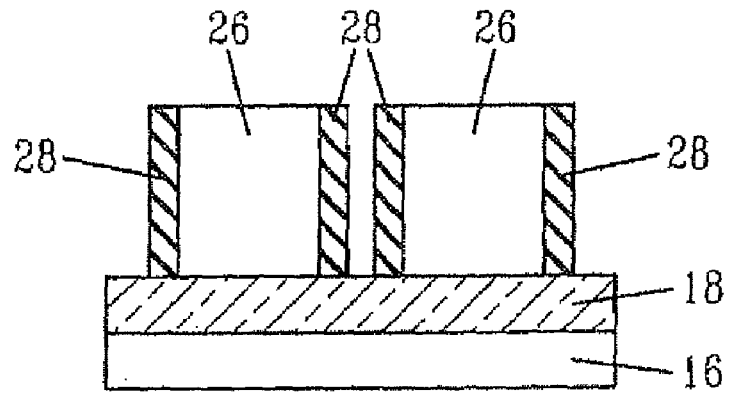
Figure 7C:
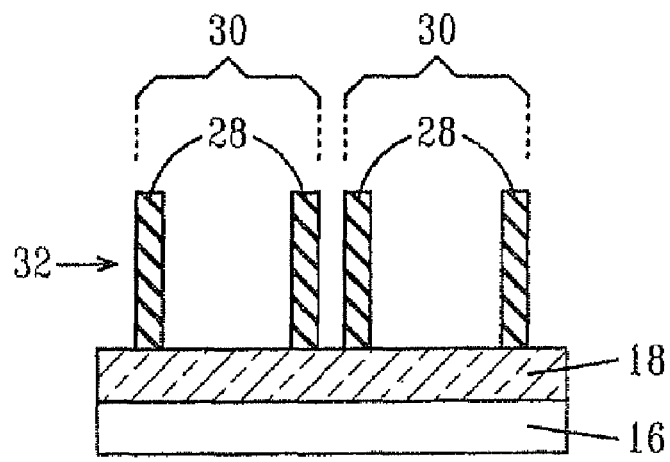

Following the formation of the structure shown in FIG. 5B, the gate conductor 126 can be patterned by lithography and etching. The lithographic step includes applying a photoresist to the gate conductor 126, exposing the photoresist to a desired pattern of radiation and developing the pattern using a conventional resist developer. The etching step includes the use of at least one of a dry etching step (including reactive-ion etching (RIE), ion beam etching (IBE), plasma etching or laser ablation), or a chemical wet etching process. A combination of various etching techniques can also be used.

At least one spacer (not shown) is typically formed on exposed sidewalls of each of the patterned gate conductors that include channel region 120. The at least one spacer is comprised of an insulator such as an oxide, nitride, oxynitride and/or any combination thereof. Preferably, the at least one spacer is comprised of SiN. The at least one spacer is formed by deposition and etching.

Source/drain diffusion regions 128 (see FIG. 8C) are then formed into the substrate 102, for example the top semiconductor layer 108 of the semiconductor-on-insulator substrate. The source/drain diffusion regions are formed utilizing ion implantation and an annealing step. The annealing step serves to activate the dopants that were implanted by the previous implant step. The conditions for the ion implantation and annealing are well known to those skilled in the art. The source/drain diffusion regions may also include extension implant regions, which are formed prior to source/drain implantation using a conventional extension implant. The extension implant may be followed by an activation anneal, or alternatively the dopants implanted during the extension implant and the source/drain implant can be activated using the same activation anneal cycle. Halo implants are also contemplated herein. It is noted that doping of the Si-containing gate conductors can occur during the aforementioned implantations.

The above description in reference to FIGS. 8A-8C illustrates the formation of an FET structure that can include the channel region 120 of the present invention. It is noted that channel region 120 may also be referred to herein as a region that includes channel array elements that have a uniform size, e.g., width, as well as spacing between each of the individual channel elements. Specifically, the channel region 120 comprises an array of wires that are composed of semiconductor material that has been protected by block A after block B has been selectively removed from that at least one opening.

In accordance with the present invention, the channel array elements, i.e., individual channels 122, have uniform and regular spacing between each of the elements that is equal to or less than 100 nm and each channel element has a width that is equal to or less than 50 nm. More specifically, the channel array elements, i.e., individual channels 122, have uniform and regular spacing between each of the elements from about 5 to about 50 nm and each channel element has a width from about 5 to about 40 nm. It is noted that each neighboring channel 122 within the array is located within a distance that is equal to or less than twice the width of an individual channel of the array. The variation of the channel element width is less than 25 percent of the average width, and the variation of the regular spacing between channel elements in the array is less than 25 percent of the mean spacing between channel array elements.

The channel elements of the present invention, i.e., semiconductor wires, are characterized as having a length from about 1 nm to less than about 1 micron. The channel elements of the present invention have a width of about 1 nm to less than about 1 micron, preferably about 5 nm n to about 30 nm. The channel elements of the present invention have an aspect ratio (i.e., height to width ratio) that is on the order of about 0.25:1 or greater, preferably, from about 0.25:1 to about 1000:1.

The method of forming the inventive channel region 120 will now be described in greater detail. Specifically, the channel region 120 is formed by first forming at least one opening in the semiconductor substrate 102. The at least one opening is used in the present invention in defining the channel region 120 for the semiconductor device. The at least one opening is formed by conventional lithography and etching. The lithographic and etching steps used in forming the at least one opening may include the same processing as described above for making a trench isolation region.

Following the formation of the at least one opening, a block copolymer that is capable of undergoing self-assembly is employed. Block copolymers employed in the present invention consist of amphiphilic components which are attached by covalent bonding. Examples include, but are not limited to: linear diblock, triblock, and multiblock copolymers, star copolymers, and graft copolymers. In the present invention, diblock and triblock copolymers are typically used. Because of the incompatibility between the polymer molecules and connectivity constraints, block copolymers spontaneously self-assemble into microphase-separated nanometer size domains that exhibit ordered morphologies at equilibrium. In a given block copolymer system, the relative chain lengths of the blocks determine the resulting morphology. Commonly observed microdomain morphologies in bulk samples include periodic arrangements of lamellae, cylinders, and spheres. The sizes and periods of these microdomain structures are governed by the chain dimensions and are typically on the order of 10 nm. Sub-10 nm structures are also obtainable by choosing appropriate blocks with a high Flory-Huggins interaction parameter and decreasing the block lengths. Ordered structures can form in any block copolymer which has sufficient incompatibility between the blocks (determined by the degree of polymerization N, the Flory-Huggins interaction parameter, and the copolymer architecture and block lengths).

The block copolymers employed in the present invention typically include at least one first component, e.g., block A, that is left unaffected or is cross-linked by exposure to radiation and at least one second component, e.g., block B, that has a response to radiation. For example, if a second component of the block copolymer becomes degraded upon exposure to radiation (i.e., undergoes chain scission), while a first component of the block copolymer is left unaffected or is cross-linked, then the second component can be removed by this method, leaving behind the first component, which maintains its original structure or pattern. Types of radiation, which can be used, include electromagnetic radiation (UV light/x-rays), electron beams, beams of nuclear particles, etc. For example, it is known that poly(methyl methacrylate) (PMMA) can be degraded effectively by exposure to an electron beam or ultraviolet light, while polystyrene PS is much more stable. Thus, a self-assembly process using diblock copolymers composed of polystyrene (PS) and poly(methyl methacrylate) (PMMA) can be used in the present invention.

Other types of diblock copolymers that can be used in the present invention include, but are not limited to: polyethyleneoxide-polyisoprene, polyethyleneoxide-polybutadiene, polyethyleneoxide-polystyrene, polyethyleneoxide-polymethylmethacrylate, polystyrene-polyvinylpyridine, polystyrene-polyisoprene, polystyrene-polybutadiene, polybutadiene-polyvinylpyridine, and polyisoprene-polymethylmethacrylate. The morphology of the self-assembled diblock copolymer thin film may be adjusted by varying the relative molecular weight ration of the two polymer blocks composing the diblock copolymers. For ratios greater than about 80:20, the diblock copolymer assembles into a spherical phase. For ratios between about 60:40 and 80:20, the diblock copolymer assembles into a cylindrical phase. For ratios between about 50:50 and 60:40, the film takes on a lamellar phase.

In addition to radiation, other methods may be used to effect changes in block B (i.e., to remove block B while minimally affecting block A). For example, block B may be removed by ozone treatment, reactive ion etching, wet chemical or ion beam etching.

In one embodiment of the present invention, the block copolymer employed in the present invention has the formula A-B or A-B-A, where A is a polymer of a mono alkenyl arene and B is a polymer of acrylic or methacrylic acid or an ester thereof. It is again noted that block B of the block copolymer is a polymer that can be readily removed from the copolymer during a subsequent removal process.

Mono alkenyl arenes within the contemplation of the present invention are vinyl aromatic monomers which include, for example, styrene, α-methylstyrene, p-methylstyrene, p-tert-butylstyrene, 1,3-dimenthylstyrene, vinyl toluene, vinyl napthalenes and mixtures thereof. Of these vinyl aromatic compounds, styrene is most preferred due to its easy availability and relatively low cost.

Block A of the copolymer used in the present invention typically has a molecular weight from about 10 to about 100 kg/mol, with a molecular weight from about 20 to about 50 kg/mol being more typical. When a triblock copolymer is used, each end block A may have the same or different molecular weight. When the two end blocks A of the triblock copolymer have different molecular weights, the molecular weights of the two end segments are within the range provided above. When polystyrene is used as block A, the polystyrene typically has a molecular weight from about 10 to about 100 kg/mol, with a molecular weight from about 20 to about 50 kg/mol being more typical.

In the specific embodiment mentioned above, block B of the block copolymer is acrylic acid, methacrylic acid or an ester thereof. Examples of such polymers include acrylic acid, methacrylic acid, methyl methacrylate, ethyl acrylic acid, ethyl methacrylate, n-butyl methacrylic, isobutyl methacrylate, isodecyl methacrylate, lauryl methacrylate, stearyl methacrylate, and the like. Preferably, block B of the block copolymer is methyl methacrylate.

Block B of the block copolymer used in the present invention typically has a molecular weight from about 5 to about 50 kg/mol, with a molecular weight from about 10 to about 30 kg/mol being more typical. When poly(methyl methacrylate) (PPMA) is used as block B, the PMMA typically has a molecular weight from about 5 to about 50 kg/mol, with a molecular weight from about 10 to about 30 kg/mol being more typical.

As indicated above, the block copolymer used in forming the channel region 120 may comprise an asymmetric block copolymer or a symmetric block copolymer. For a typical block copolymer employed in the present invention, the amount of block A is from about 20 to about 80 and the remainder is the B block. The amounts are based on the total weight of the copolymer and thus they are in terms of the specific block's weight %.

In one embodiment, the block copolymer may comprise an asymmetric diblock copolymer that comprises about 60% or greater, preferably from about 60% to about 80%, of block A, and about 40% or less, preferably from about 20% to 40%, of B block. This embodiment provides a template for etching the device channel array in which each of the individual channel array elements is defined by the matrix of cylindrical phase diblock copolymer pattern. In another embodiment, the block copolymer may comprise a symmetric diblock copolymer that comprises from about 40% to about 60%, preferably 50%, of block A, and from about 40% to about 60%, preferably 50%, of block B. In this embodiment, the template for defining the device channel array is provided in which each of the individual channel array elements is defined by a lamellar (i.e., sheet-like) polymer domain. In yet another embodiment, another asymmetric diblock copolymer is used in which block A is present in an amount of less than about 40%, preferably from about 20% to about 40%, and block B is present in an amount of greater than about 60%, with an amount from about 60% to about 80% being more preferred. In this embodiment, the template for the device channel array is provided in which each of the individual array elements is defined by a cylindrical polymer domain. The amounts of each of the blocks are based on weight percent of the total copolymer.

In a preferred embodiment, block A is comprised of polystyrene (PS) and block B is comprised of a poly(methyl methacrylate) (PMMA).

The block copolymer is formed into the at least one opening utilizing a conventional deposition process such as, for example, spin-on coating, CVD, plasma-assisted CVD, evaporation, chemical solution deposition and other like techniques. It is noted that during the deposition of the block copolymer within the at least one opening, some of the block copolymer is formed atop the surface of the semiconductor substrate 102.

Following the deposition of the block copolymer within the at least one opening, the block copolymer may be subjected to conventional drying steps in which residual solvent is removed from the deposited film. During the drying step, or in a subsequent heating step, the heating or drying temperature causes the individual polymers within the block copolymer to undergo a microphase separation. The microphase separation results in the formation of line/space patterns within the film.

After the deposition and subsequent drying and/or heating, block B is selectively removed within the at least one opening to provide the pattern for forming the inventive channel region 120. In one embodiment of the present invention, the selective removal of block B can be performed by exposing the deposited copolymer to radiation and then immersing the exposed block copolymer in a chemical solvent. Specifically, a UV exposure is performed by applying radiation having a wavelength from about 170 to about 400 nm, preferably from about 190 to about 300 nm, onto the deposited copolymer. The UV exposure may be performed at a substrate temperature from about 100 to about 100° C. The UV exposure may be performed using a continuous exposure or pulsed exposure. The UV exposure effects block B by, in this case, chain-scissoring the PMMA to make it soluble in a suitable solvent. At the same time, the UV exposure cross-links block A (polystyrene). It is noted that the UV exposure is optional and is not required.

The chemical solvent that can be used in selectively removing block B includes any solvent in which block B is soluble and in which block A is insoluble. For example, the chemical solvent used following the UV exposure step can include: acetic acid, isopropyl alcohol, or methyl iso-butyl ketone.

In addition to UV exposure and immersing in a chemical solvent, the selective removal process of the block B from the matrix of the deposited polymer can be performed by exposing the deposited polymer to ozone. The ozone exposure is performed at a substrate temperature from about 10° to about 100° C. The ozone exposure includes the use of any ozone-containing source including, for example, air.

Following the selective removal process, one or more etching steps such as reactive-ion etching, can be used to transfer the pattern provided by block A into the underlying semiconductor substrate 102. During one of the later etching processing, the remaining block A of the block copolymer is removed from the structure.

The above discussion provides a broad description of the inventive self-assembly method that can be used in the present invention in forming the channel region. The following details three different methods for forming line/space array patterns using the diblock copolymer self-assembly process mention above. Each of these methods relies upon a different type of composition of diblock copolymer material to form the pattern. Note that the reference numerals in the remaining drawings have the same meaning as defined above, unless otherwise specified.

Method 1

Embodiment 1

Figure 9A:
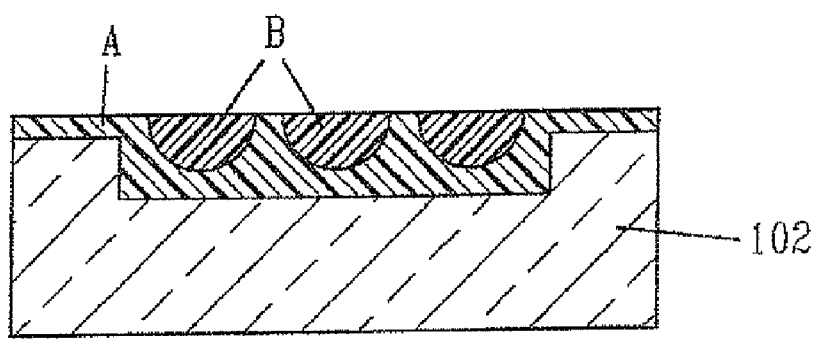
FIGS. 9A-9B are pictorial representations (through cross sectional views) illustrating the formation of aligned polymer patterns using a first embodiment of the block copolymer assembly process of the present invention.
Figure 9B:
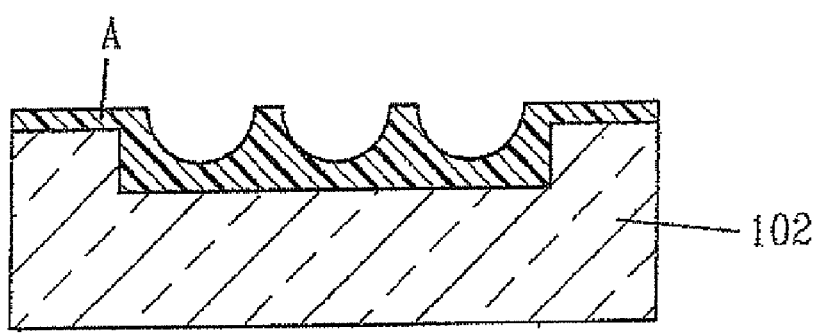

This method utilizes an asymmetric A-B diblock copolymer in which block A is present as the majority component and block B is present in lesser amounts than block A. In these examples, the polymer block B is one which can be preferentially removed from the film, e.g., by exposure to UV radiation and immersion in a chemical solvent, or by exposure to ozone. When a polymer of this composition is applied to a surface containing a lithographically defined topography (FIG. 9A), a resulting line/space pattern forms in which half-cylinders of block B are embedded in a matrix of block A. The resulting pattern self aligns with the preexisting topography. Removal of block B leaves the lithographically-defined line subdivided into periods of the underlying block A matrix. This is illustrated in FIG. 9B.

Method 2

Embodiment 2

Figure 10A:
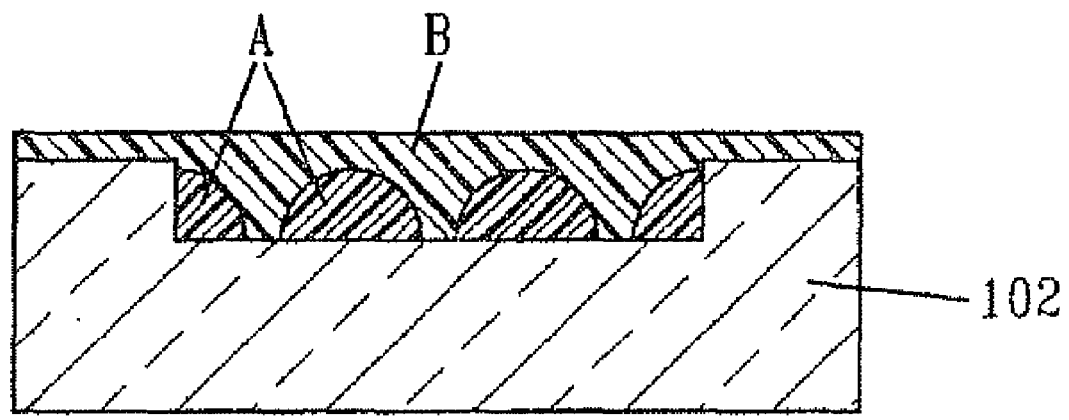
FIGS. 10A-10B are pictorial representations (through cross sectional views) illustrating the formation of aligned polymer patterns using a second embodiment of the block copolymer assembly process of the present invention.
Figure 10B:
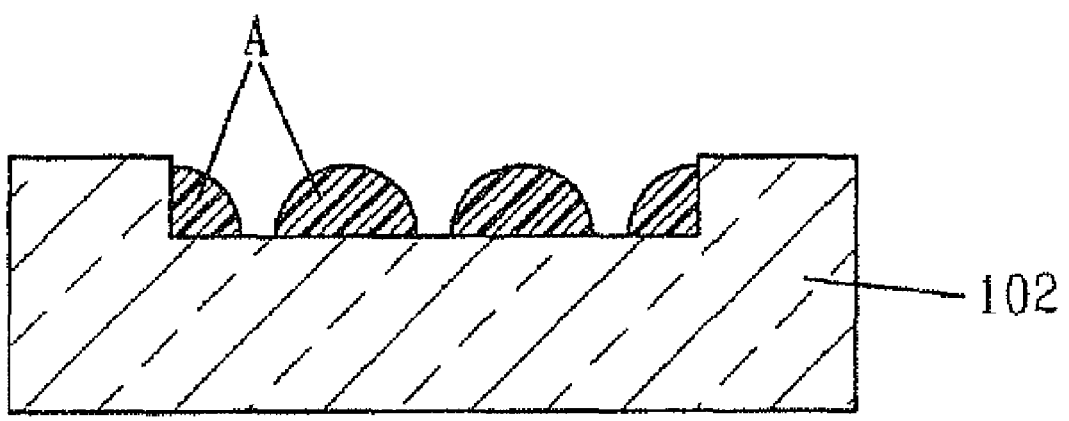

This method utilizes an asymmetric A-B diblock copolymer in which block A is present as the minority component and block B is present in a greater amount. In these examples, the polymer block B is one which can be preferentially removed from the film, e.g., by exposure to UV radiation and immersion in a chemical solvent, or by exposure to ozone. When a polymer of this composition is applied to a surface containing a lithographically defined topography (FIG. 10A), a resulting line/space pattern forms in which half-cylinders of block A are embedded in a matrix of block B. The resulting pattern self aligns with the preexisting topography. Removal of block B leaves the lithographically-defined line subdivided into periods of the underlying block A matrix. This is illustrated in FIG. 10B.

Method 3

Embodiment 3

Figure 11A:
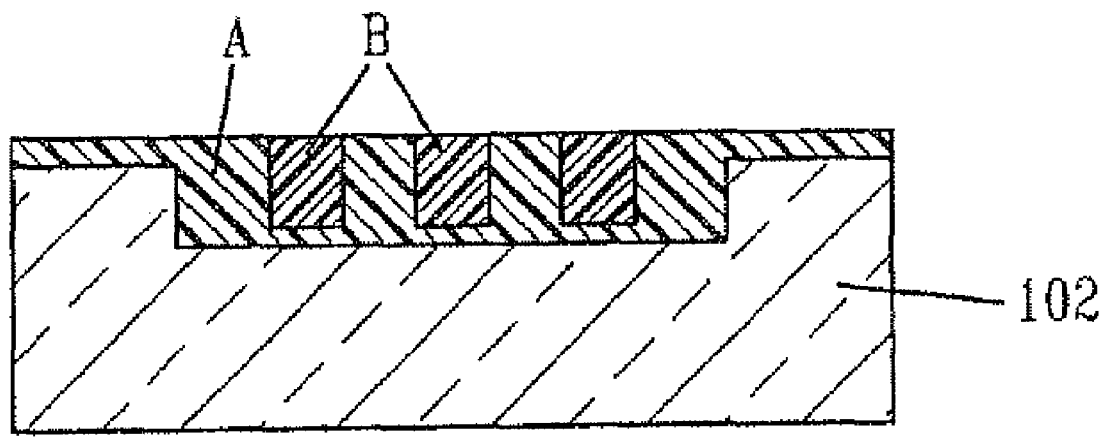
FIGS. 11A-11B are pictorial representations (through cross sectional views) illustrating the formation of aligned polymer patterns using a third embodiment of the block copolymer assembly process of the present invention.
Figure 11B:
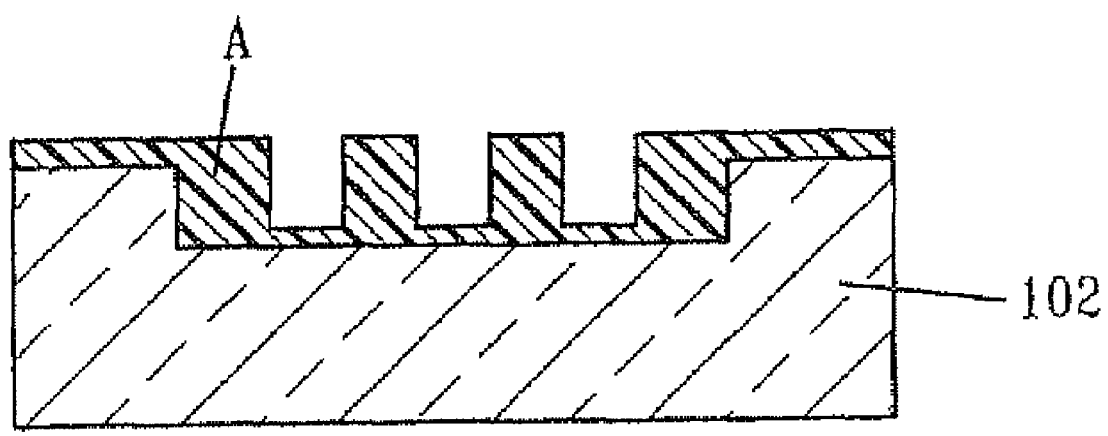

Symmetric A-B diblock copolymer is used and is applied within an opening as discussed above. In this example, blocks A and B have substantially the same weight % in the total block copolymer and block B is a block which can be preferentially removed from the polymer film, e.g., by exposure to UV radiation and immersion in a chemical solvent, or by exposure to ozone. When a polymer of this composition is applied to a surface containing a lithographically defined topography (FIG. 11A), a resulting line/space pattern forms in which lines/spaces of block A are embedded in a matrix of block B. The resulting pattern self aligns with the preexisting topography. Removal of block B leaves the lithographically-defined line subdivided into periods of the underlying block A matrix. This is illustrated in FIG. 11B.

After the array pattern is formed in the diblock copolymer material using any of the three above-described methods, it can be used to template the patterning of underlying materials. One method by which this templating could take place is described herein, although there are other examples. It is noted that although detail methods for forming an array of semiconducting wires is provided, the technique described above can similarly be used to form wire arrays of conducting materials (e.g., metals) or wire arrays of insulating materials.

Figure 12A:
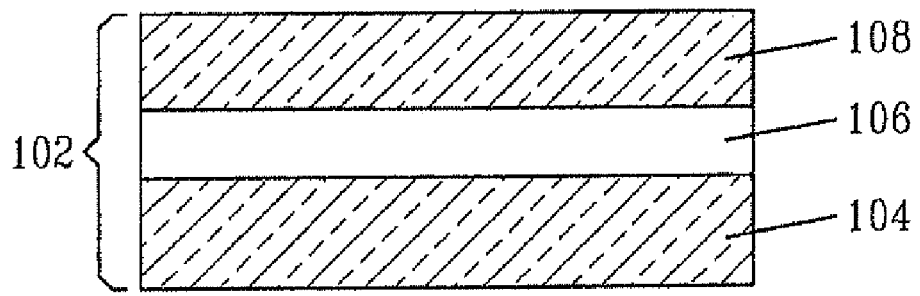
FIGS. 12A-12G are pictorial representations (through cross sectional views) illustrating the process flow for forming semiconductor nanowire arrays using one of the self-assembly processes of the present invention.
Figure 12B:
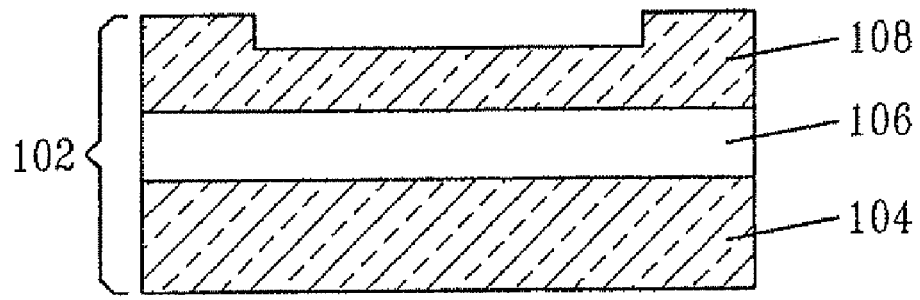
Figure 12C:
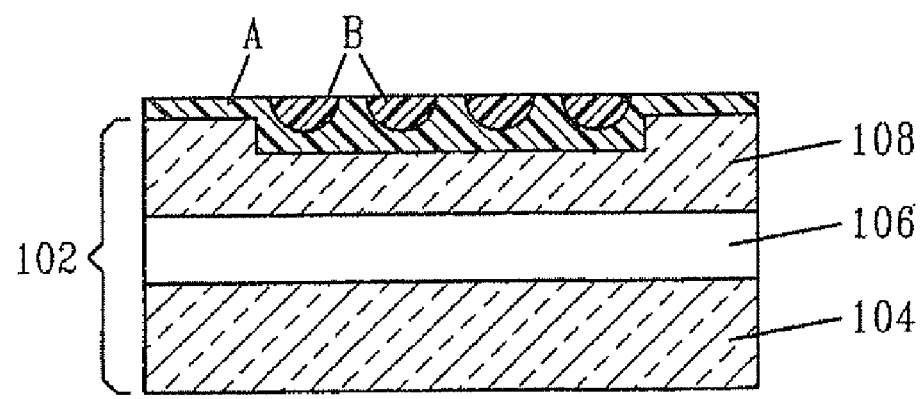
Figure 12D:
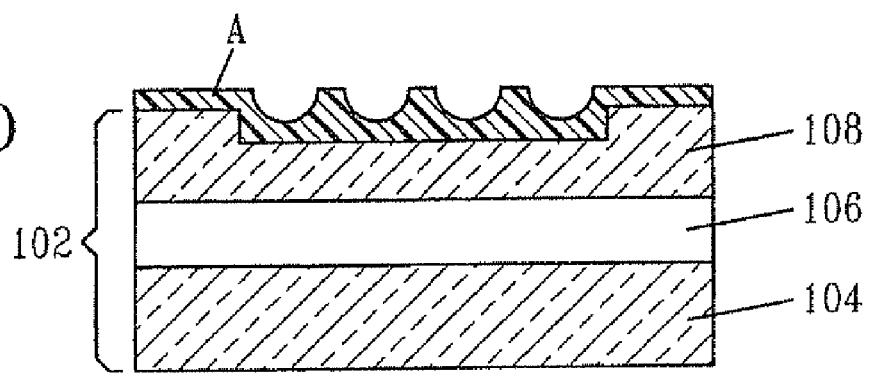
Figure 12E:
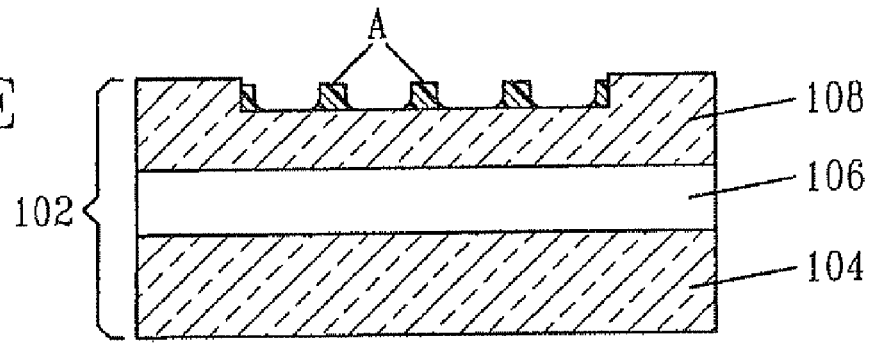
Figure 12F:
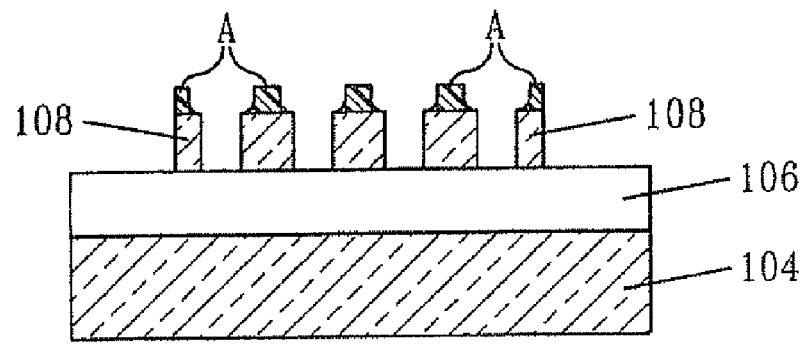
Figure 12G:
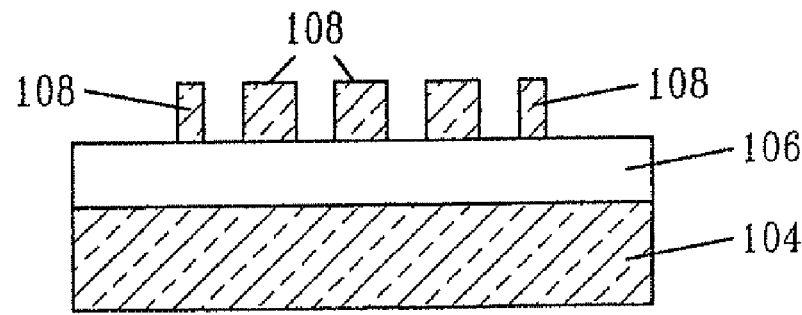

The process for forming arrays of silicon wires is shown schematically in FIGS. 12A-12G. The initial semiconductor substrate 102, shown in FIG. 12A, is a semiconductor-on-insulator (SOI) substrate, in which a thin top semiconductor layer 108 is separated from the semiconductor substrate 104 by a buried insulator 106. Conventional lithography and etching are used to create a topographic pattern in the top semiconductor layer 108 (see, FIG. 12B). Diblock copolymer self-assembly subdivides this topographic pattern into smaller scale lines and spaces (FIGS. 12C and 12D). In this example, the assembly method 1, described above is used. Reactive ion etching in oxygen removes polymer material from between the lines in the self-assembled pattern (see, FIG. 12E). Reactive ion etching of silicon removes silicon from everywhere not protected by polymer, leaving only a line/space pattern remaining (e.g., FIG. 12F). A second reactive ion etch in oxygen removes any remaining polymer. (see, FIG. 12G).

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor structure comprising:
    forming at least one opening in a semiconductor substrate, said at least one opening defining a channel region for a semiconductor device;
    forming a block copolymer within said at least one opening and extending on an upper surface of said semiconductor substrate that is adjacent said at least one opening, said block copolymer having the formula A-B or A-B-A, where block A comprises a polymer of a mono alkenyl arene and block B is a polymer of acrylic acid, methacrylic acid or an ester thereof,
    selectively removing block B from within the at least one opening, leaving block A as a patterned mask;
    etching exposed portions of the semiconductor substrate within the at least one opening to provide an array of more than one electrically isolated channel within the channel region and having a space there between, said space between each neighboring channel is located within a distance that is less than or equal to twice the width of each channel of said array;
    forming a gate dielectric layer on sidewall surfaces and an upper surface of each of said electrically isolated channels;
    forming a gate conductor layer on said gate dielectric layer and on exposed surfaces of the semiconductor substrate not including said array of more than one electrically isolated channel; and
    forming a source diffusion region laterally abutting one end of each of said array of more than one electrical isolated channel and forming a drain diffusion region laterally abutting another end of each of said array of more than one electrical isolated channel.

2. The method of claim 1 wherein said forming said at least one opening comprises lithography and etching.

3. The method of claim 1 wherein said semiconductor substrate comprises a semiconductor-on-insulator.

4. The method of claim 1 wherein forming said block copolymer comprises a deposition process.

5. The method of claim 1 wherein block A is polystyrene and block B is poly(methyl methacrylate).

6. The method of claim 1 wherein said block A has a molecular weight from about 10 to about 100 kg/mol, and said block B has a molecular weight from about 5 to about 50 kg/mol.

7. The method of claim 1 wherein said block A is present in an amount from about 20 to about 80%, and said block B is present in an amount from 80 to 20%.

8. The method of claim 1 wherein said block copolymer is an asymmetric diblock comprising about 60% or greater of block A, and about 40% or less of block B.

9. The method of claim 1 wherein said block copolymer is a symmetric diblock comprising from about 40 to about 60% block A, and from about 40 to about 60% block B.

10. The method of claim 1 wherein said block copolymer is an asymmetric diblock comprising about 40% or less of block A, and about 60% or greater of block B.

11. The method of claim 1 wherein said selectively removing comprises exposure to UV radiation and immersing in a chemical solvent.

12. The method of claim 1 wherein said selectively removing comprises exposure to ozone.

13. The method of claim 1 wherein said etching comprises reactive ion etching.

14. The method of claim 1 wherein said source diffusion region, said drain diffusion region, and said array of more than one electrically isolated channel are a same semiconductor material and have a same crystallographic orientation.

15. A method of forming a semiconductor structure comprising:
   forming at least one opening in a semiconductor substrate, said at least one opening defining a channel region for a semiconductor device;
   forming a block copolymer within said at least one opening and extending on an upper surface of said semiconductor substrate that is adjacent said at least one opening, said block copolymer having at least one A block and at least one B block, wherein said at least one A block comprises a polymer that is not affected or cross-linked upon subjecting said block copolymer to a treatment step, while said at least one B block comprising a polymer that is affected or cross-linked upon subjecting said block copolymer to said treatment;
   selectively removing block B from within the at least one opening, leaving block A as a patterned mask;
   etching exposed portions of the semiconductor substrate within the at least one opening to provide an array of more than one electrically isolated channel within said channel region and having a space there between, said space between each neighboring channel is located within a distance that is less than or equal to twice the width of each channel of said array;
   forming a gate dielectric layer on sidewall surfaces and an upper surface of each of said electrically isolated channels;
   forming a gate conductor layer on said gate dielectric layer and on exposed surfaces of the semiconductor substrate not including said array of more than one electrically isolated channel; and
   forming a source diffusion region laterally abutting one end of each of said array of more than one electrical isolated channel and forming a drain diffusion region laterally abutting another end of each of said array of more than one electrical isolated channel.

16. The method of claim 15 wherein said block copolymer comprises polyethyleneoxide-polyisoprene, polyethyleneoxide-polybutadiene, polyethyleleoxide-polystyrene, polyetheleneoxide-polymethylmethacrylate, polystyrene-polyvinylpyridine, polystyrene-polyisoprene, polystyrene-polybutadiene, polybutadiene-polyvinylpyridine, polyisoprene-polymethylmethacrylate, or polystyrene-polymethylmethacrylate.

17. The method of claim 1 wherein said block copolymer is a triblock copolymer, a multiblock copolymer, a star copolymer, or a graft copolymer.

18. The method of claim 15 wherein said source diffusion region, said drain diffusion region, and said array of more than one electrically isolated channel are a same semiconductor material and have a same crystallographic orientation.

* * * * *